(12) United States Patent
Khoche et al.

(10) Patent No.: US 7,137,053 B2
(45) Date of Patent: Nov. 14, 2006

(54) BANDWIDTH MATCHING FOR SCAN ARCHITECTURES IN AN INTEGRATED CIRCUIT

(75) Inventors: Ajay Khoche, Cupertino, CA (US); Jochen Rivoir, Magstadt (DE); David H. Armstrong, Boulder, CO (US)

(73) Assignee: Verigg IPco, Singapore (SG)

( * ) Notice: Subject to any disclaimer, the term of this patent is extended or adjusted under 35 U.S.C. 154(b) by 789 days.

(21) Appl. No.: 09/946,857

(22) Filed: Sep. 4, 2001

(65) Prior Publication Data

US 2003/0046623 A1    Mar. 6, 2003

(51) Int. Cl.
   *G01R 31/28*  (2006.01)

(52) U.S. Cl. ...................................... 714/726
(58) Field of Classification Search ................ 714/731, 714/729, 726, 727, 728, 724, 744; 324/765
   See application file for complete search history.

(56) References Cited

U.S. PATENT DOCUMENTS

| | | | | |
|---|---|---|---|---|
| 5,623,503 A | * | 4/1997 | Rutkowski | 714/727 |
| 5,812,561 A | * | 9/1998 | Giles et al. | 714/726 |
| 6,370,664 B1 | * | 4/2002 | Bhawmik | 714/729 |
| 6,591,388 B1 | * | 7/2003 | Vonreyn | 714/726 |

* cited by examiner

*Primary Examiner*—James C Kerveros

(57) ABSTRACT

An integrated circuit, including a configurable scan architecture used for an integrated circuit test procedure and quality control. The configurable scan chain architecture has the capability of being reconfigured to one of a variety scan chain architectures based on the constraints of the integrated circuit and the testing device. The present invention minimizes the integrated circuit test time by reconfiguring the scan architecture depending on certain constraints such as the latching frequency, the predetermined I/O frequency, the number of available integrated circuit I/O pins, the number of pins required for a proposed scan architecture, and the number of available pins on the testing device. The configurable scan architecture receives configuration signals which indicate which scan chain architecture should be configured on the integrated circuit that is being tested.

21 Claims, 5 Drawing Sheets

BANDWIDTH MATCHING FOR SCAN ARCHITECTURES IN AN INTEGRATED CIRCUIT

BACKGROUND OF THE INVENTION

1. Field of the Invention

The present invention relates to a Design for Test ("DFT") technique which includes a scan architecture within an integrated circuit, and more particularly the present invention allows one to match bandwidth requirements of scan architecture, chip I/O, and an associated testing device. Moreover the present invention relates to techniques that can be utilized to reconfigure and support architectures that have various bandwidth requirements.

2. Description of the Related Art

Several Design for Test (DFT) techniques exist in Integrated Circuit (IC) testing, one of which involves implementing scan architectures on an IC. A scan architecture enables the ability to shift through any combinations of state values along with an ability to capture response(s) to the state values from elements within the IC. During testing of an IC, the scan architecture within the IC connects state elements in one or more scan chains. These scan chains, or shift registers, shift predetermined state values into the state elements in order to test a variety of possible inputs. After shifting the state values into the state elements, the IC returns to a normal functioning mode. One or more outputs (responses) are captured at the input(s) of the state elements. The IC then may enter a shift mode, which causes the captured response(s) to be shifted out of the IC and to a test device where the captured responses are compared with an expected output. If the captured response(s) match an expected output, then the IC may be functioning properly for the predetermined state value(s) shifted into the scan chains.

The current state-of-the-art for testing ICs, described with reference to FIG. 1, is to design a scan chain architecture 108 independently of a testing device's 106 capabilities. Within an IC 100 is the scan chain architecture 108 which includes a plurality of scan chains 102. The scan chains 102 are permanent and not configurable after the manufacture of the IC 100. The scan chains are basically shift registers which allow test data to be shifted into the IC 100 and out of the IC 100 when the IC is being tested. Generally, a test device 106 is electrically connected to the scan chains 102 allow for testing of the IC 100. Typically, the testing device 106 interfaces with available IC pins 104 to deliver test data to the scan chains 102 and extract the captured response(s) from the scan chains 102. The number of scan chains 102 implemented on the IC 100, as well as the latching frequency (scan chain's I/O frequency of operation), are designed based on the IC's physical constraints such as the number of pins 104, power consumption, and the operating frequency of the IC 100. Existing scan chain architectures determine the number of scan chains 102 to incorporate into an IC 100 by taking into consideration how may IC pins 104 can be used for scan chain interfaces. Furthermore, existing scan architectures design the latching frequency of the scan chains 102 to be much lower than the maximum possible I/O frequency of the IC 100. Once the number of scan chains 102 and the latching frequency are determined and the scan chain architecture is designed for and placed into the IC 100, these scan chain constraints and architecture cannot be altered.

A recent U.S. Provisional patent application described the idea of reconfigurable scan chains (U.S. Provisional Patent Application, Ser. No. 60/229,653) for reconfiguring the scan architecture to match the number of pins of a testing device. It is discussed that scan chains/segments can be cascaded using multiplexers to reduce the number of pins required for the scan interface. A drawback of the disclosed invention is that it does not take into account the frequency of the channels of the testing device to optimized the bandwidth across the interface between the testing device and the I/O of the integrated circuit ("IC") being tested and between the scan chains and the I/O of the IC being tested.

The present techniques result in sub-optimal use of the available bandwidth between the IC I/O and the scan chains on the IC. Additionally, the scan chains are permanent fixtures that cannot be reconfigured or updated to coincide with updated test conditions or updated and advanced testing devices. Therefore, an IC may be rendered untestable by a testing device when test conditions or test devices are changed or modified. Furthermore, if an IC with a non-configurable scan architecture remains testable by an updated testing device or under updated test conditions, then longer test times or lower fault coverage may result.

The time required to test the IC and collect the response varies depending on, among other things, the number of available IC pins, I/O frequency of the IC, testing device frequency, and the amount of test data. For example, for a given test data volume, the test time is limited by the bandwidth (maximum data rate) of the IC, which is proportional to the product of the frequency and the number of test pins of the IC. The bandwidths of the integrated circuit testing device and the number of available test pins on the IC, as well as the scan chain architecture also limit the efficiency of an IC test. The testing device bandwidth limits how quickly the testing device can communicate test data to and from the IC pins. The bandwidth of the available IC pins limits how quickly test data is brought into the IC, and the latching frequency of the scan chains limit how quickly the scan chains latch in or latch out the test data.

Therefore, there is a need for a flexible scan chain architecture that has the capability of reconfiguring to one of various scan architectures based on the constraints of the IC and an associated testing device such that tests performed on an IC can be performed in a minimum amount of time with a high degree of accuracy and fault coverage.

SUMMARY OF THE INVENTION

The present invention relates to a DFT scheme where a scan architecture can be designed to be reconfigurable to match the bandwidth along the electrical path between the testing device and the scan chains. A device utilizing the present invention may be reconfigured both for the IC pins available and for the frequency domain.

The present invention may provide a scan chain architecture that can be reconfigured for bandwidth optimization in order to maximize the test capacity utilization of the testing device and to minimize testing time. A technique utilized by embodiments of the present invention involves adding demultiplexers to fanout data from a faster channel to multiple slow receiver scan chains and adding multiplexers to collect data from any slow sources into a faster link.

The invention further relates to a scan chain architecture that can be reconfigured to maximize test capability utilization, minimize testing time, and be adaptable to a variety of test devices and scenarios. Preferred embodiments of the present invention may adjust the existing scan chain architecture on an IC to a configuration that takes into account one or more variables related to the IC itself and a testing device being utilized to test the IC.

In a first embodiment of the present invention integrated circuit test time is minimized when the latching frequency of the scan chains within the IC are less than the predetermined I/O frequency of the IC and the number of available integrated circuit I/O pins is less than a number of pins required to test the IC in a proposed scan architecture and related DFT.

In a second embodiment of the present invention the integrated circuit test time is minimized when the latching frequency of the scan chains is greater than the predetermined I/O frequency and the number of available integrated circuit I/O pins is greater than the number of pins required to test the IC in the proposed scan architecture.

In a third embodiment of the present invention the integrated circuit test time is minimized when the test device's testing frequency is less than the predetermined I/O frequency of the IC, the number of testing device test pins is less than the number of available integrated circuit I/O pins, and the testing device frequency is greater than or equal to a multiple of the latching frequency of the scan chains on the IC.

In a fourth embodiment of the present invention the integrated circuit test time is minimized when the testing device frequency is greater than the predetermined I/O frequency of the IC, the number of available testing device pins is less than the number of available integrated circuit I/O pins, and the predetermined I/O frequency is less than the testing device frequency and the latching frequency of the scan chains.

In a fifth embodiment of the present invention the integrated circuit test time is minimized when the testing device frequency is greater than the predetermined I/O frequency of the IC being tested, the number of testing device pins is less than the number of available integrated circuit I/O pins, and the predetermined I/O frequency and said testing device frequency are greater than a multiple of the latching frequency.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE EXEMPLARY EMBODIMENTS OF THE INVENTION

The scan chain architectures described herein and depicted in the various FIGS. may have the disclosed multiplexers and demultiplexers added either directly on the chip or outside the chip (e.g., on an IC test board) depending on the circuit's test environment. The basic scheme of bandwidth matching is performed by adding multiplexers and demultiplexers to increase or decrease the data rate (bandwidth matching) to and from the IC or the scan chains in the IC. The multiplexers and demultiplexers may also be utilized to increase or decrease the number test pins required to perform the test on the IC.

Figure 1:
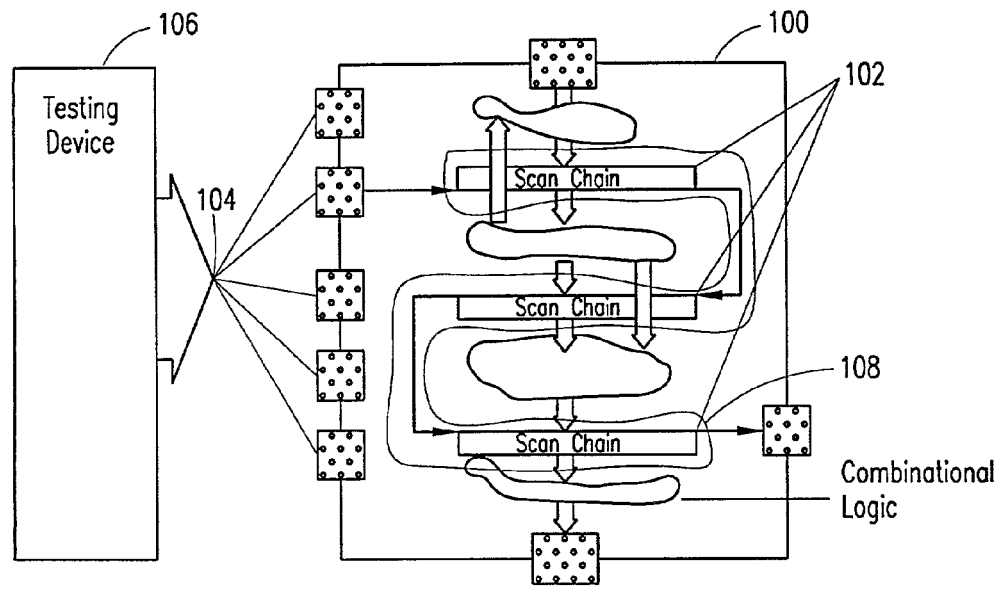
FIG. 1 is an illustration of a prior art integrated circuit including scan chains.
Figure 2:
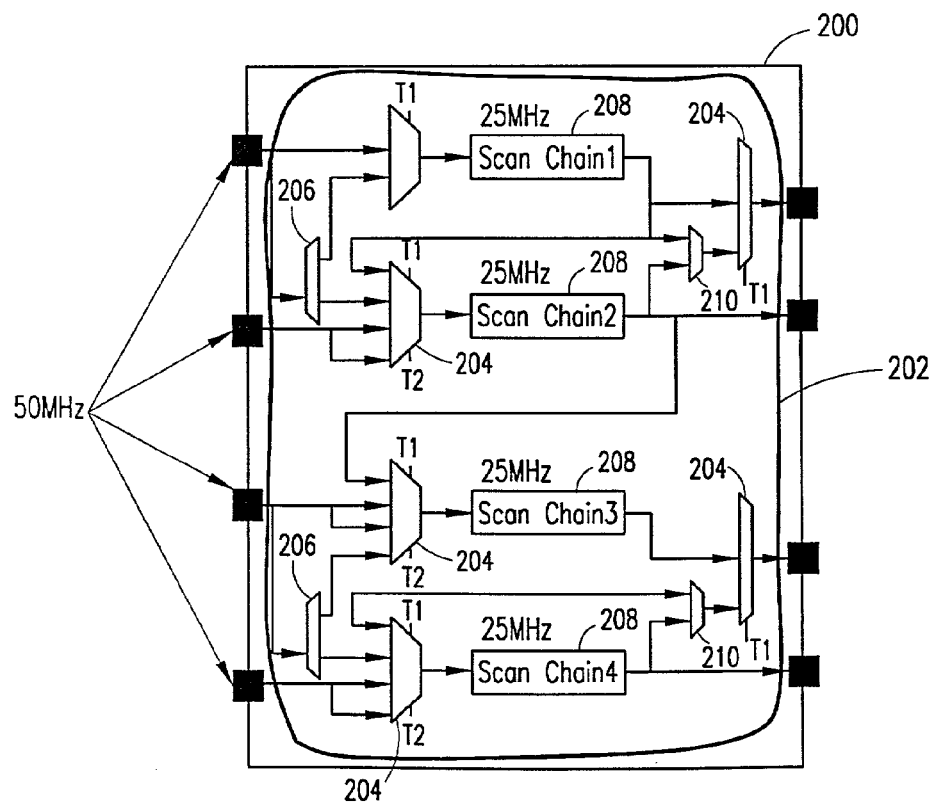
FIG. 2 is an exemplary illustration of an integrated circuit with bandwidth matching. It also includes a configurable scan architecture in accordance with a preferred embodiment of the present invention.

FIG. 2 is an exemplary illustration of an IC 200 with bandwidth matching circuitry which includes a scan architecture 202 in accordance with a preferred embodiment of the present invention. It is understood that the scan chain architecture is circuitry that is in addition to the circuitry and combination logic on the IC that is being tested. The scan architecture 202 is designed for configuration into various different scan chain architectures without alteration to the IC core. The scan architecture 202 is manufactured with configurations of scan chain architectures built in, so that when it is determined that a particular configuration should be used for testing the IC 200, the scan architecture can be modified to the determined configuration This scan architecture 202 is designed to minimize test times based on constraints of the IC 200 and the associated testing device (not shown). Depending on which configuration is implemented, the testing of the IC 200 may require the activation of at least one multiplexer 204 or demultiplexer 206 within the scan architecture 202. The multiplexers 204 provide the reconfigurablility in the device. The demultiplexers 206, if activated, split the test data received from the testing device into a plurality of streams of test data that are delivered to the plurality of scan chains 208. In order to determine if the multiplexers 204 and demultiplexers 206 should be activated, the configurable scan architecture 202 receives at least one configuration signal. The at least one configuration signal also drives the decision of which particular scan chain architecture configuration should be used. In the present example, two signals are used to configure the scan architecture 202. The two signals, T1 and T2, are used after a determination of the appropriate scan chain architecture is determined based on the bandwidth requirements of the scan chains, the chip I/O, and the testing device. Appropriate signals T1 and T2 are then applied to the scan chain architecture during testing of the device to configure the various multiplexers 204, demultiplexers 206, latches 208, signal paths to and from the scan chains as well as other associated test circuitry within the IC to a predetermined scan chain architecture. Examples of configured scan architectures 202 based on the values of the parameters discussed above are described in detail below with reference to FIGS. 3–8. It is understood that the below embodiments are examples of possible reconfigurations of exemplary configurable scan chain architecture and should not be interpreted as limiting the vast embodiment possibilities of configurations available based on the present invention.

Figure 3:
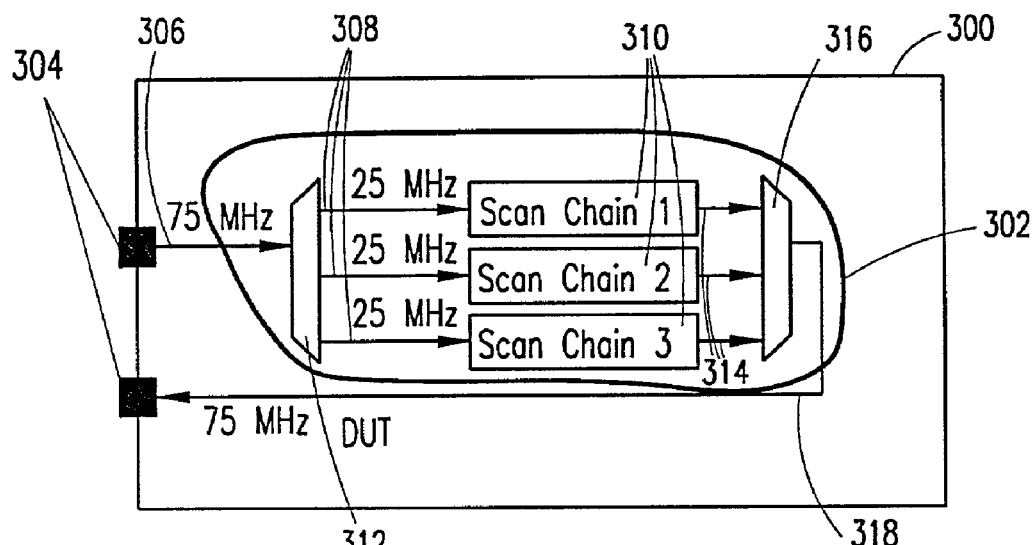
FIG. 3 is an exemplary illustration of an integrated circuit with a first configuration of the configurable scan architecture in accordance with a preferred embodiment of the present invention.

FIG. 3 is an exemplary illustration of an IC 300 configured with a first exemplary configuration of a scan architecture 302 in accordance with a preferred embodiment of the present invention. In this example, the latching frequency of the scan chains 310 is lower than the maximum I/O frequency of the IC 300, the testing device frequency is greater than or equal to the I/O frequency of the IC 300, and the number of pins 304 on the IC 300 available for the scan chain test are two which is less than the number of pins required by a proposed IC test using a testing device (not shown). To maximize bandwidth and reduce test time, the testing device merges multiple streams of test data into a single stream for delivery to the IC 300. At least one high speed channel 306 receives the test data at a high data rate, e.g. 75 MHz, at the IC 300. The high speed channel(s) 306 is split by a demultiplexer 312 into three slow channels 308, e.g. 25 MHz, on the IC 300. Note that serializers and deserializers that exist in some ICs may be used to perform the multiplexing and demultiplexing functions. The slow speed channels 308, deliver the test data to the scan chains 310, which latch the data into predetermined portions of the IC circuitry and retrieve a response therefrom. Another set of slow speed channels 314 collect the response, which is merged by at least one multiplexer 316 into a second set of high speed channels 318. The IC 300 sends the response back at a high data rate, e.g. 75 MHz, to the testing device. In essence, the high speed channels 306, 318 bring data into and out of the IC 300 at a high data rate in order to reduce test time and to accommodate the need for more test pins. It is understood that throughout the description of the exemplary embodiments of the present invention, the data rates are exemplary and the terms high speed and low speed channels are used relative to each other for descriptive purposes and are not intended to limit the speeds of the data in an exemplary invention.

Figure 4:
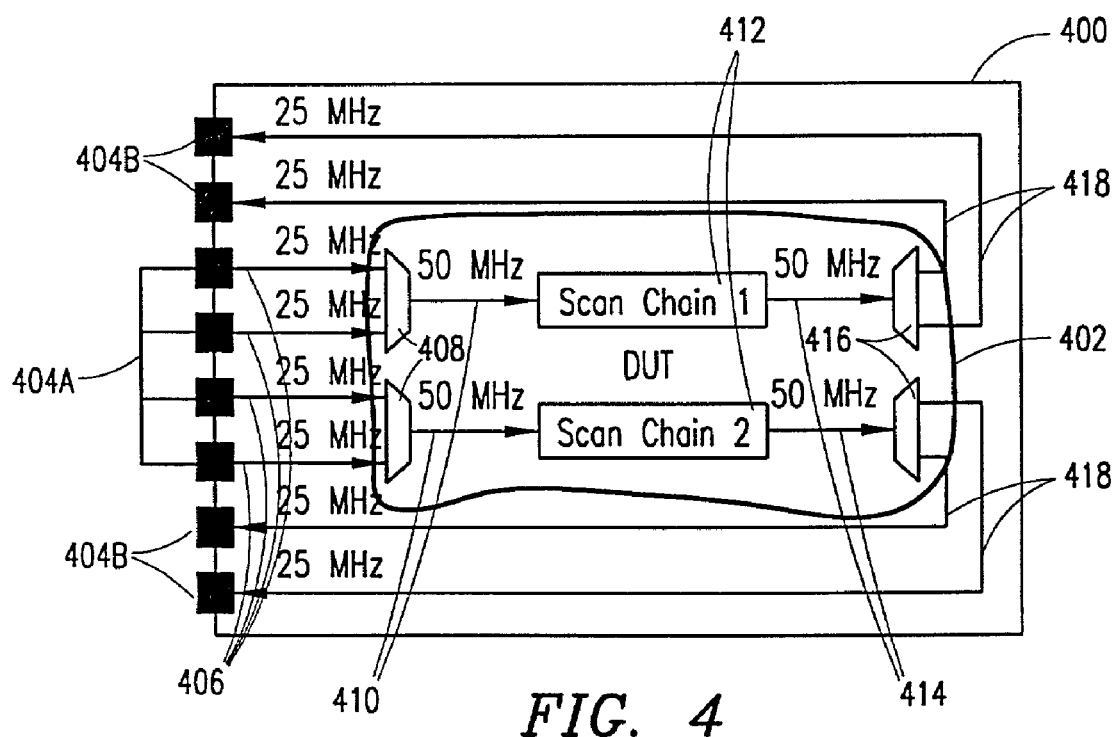
FIG. 4 is an exemplary illustration of an integrated circuit with a second configuration of the configurable scan architecture in accordance with a preferred embodiment of the present invention.

FIG. 4 is an exemplary illustration of an IC 400 configured in a second configuration of a scan chain architecture 402 in accordance with an embodiment of the present invention. In this exemplary embodiment, the latching frequency of the scan chains 410 is higher than the maximum I/O frequency of the IC 400 and the number of pins 404 on the IC 400 available for the testing procedure is greater than the number of pins required by the scan chains. In this embodiment, more I/O pins 404 (A,B) can be used to carry test data onto and off of the IC. The test data is then multiplexed and demultiplexed allowing data movement at the I/O frequency of the IC 400 to match the higher latching frequency of the scan chains 410. A testing device (not specifically shown in this FIG. 4) first delivers test data to the IC 400 using slow speed channels. The pins 404A of the IC 400 receive the test data and deliver it to the scan architecture 402 via slow speed channels 406 at, for example, a rate of 25 MHz. The slow speed channels 406 are merged by at least one multiplexer 408 into high speed channels 410, which then deliver the test data into the scan chains 412 for latching. A second set of high speed channels 414 collects the response at a faster rate, e.g. 50 MHz, from the scan chains 412. The high speed channels 414 are split by at least one demultiplexer 416 into a second set of slow speed channels 418, which deliver the response to the IC pins 404B, and in turn deliver the response from the tested data back to the testing device.

Figure 5:
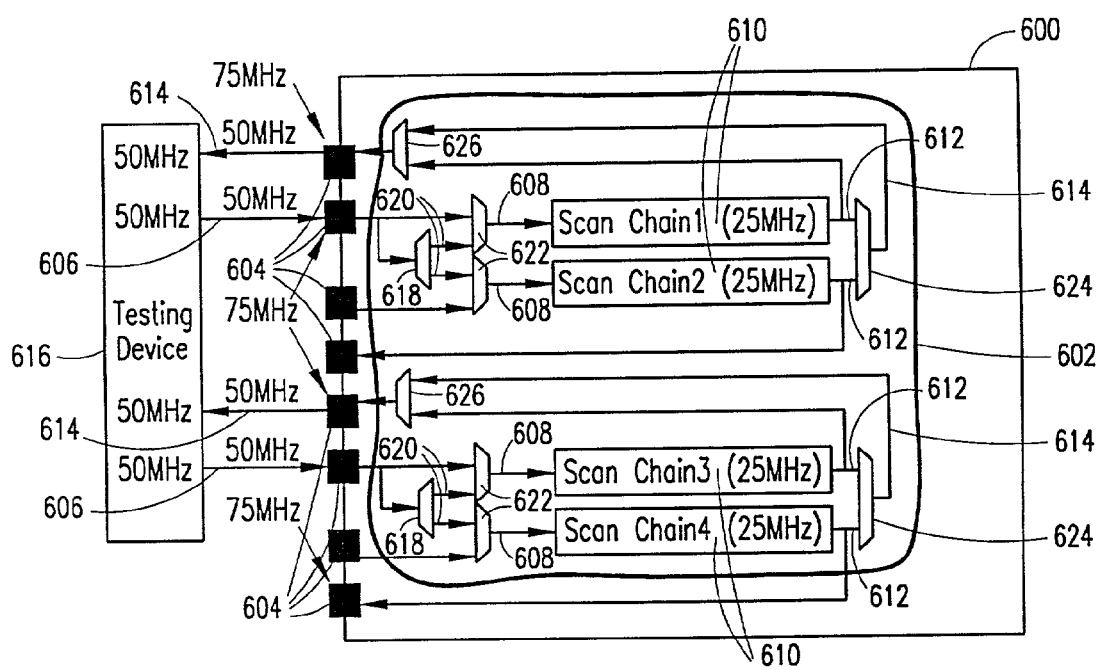
FIG. 5 is an exemplary illustration of an integrated circuit with a fourth configuration of the configurable scan architecture in accordance with a preferred embodiment of the present invention.

FIG. 5 is an exemplary illustration of an IC 600 configured in a fourth embodiment of a scan chain architecture 602 in accordance with the present invention. The IC 600, in this embodiment, has an I/O frequency greater than the testing device's test frequency, the number of pins 604 of the IC 600 is greater than the number of pins available on the testing device 616, and the testing device's testing frequency is greater than or equal to a multiple of the latching frequency of the scan chains 610 in the IC 600. The testing device 616 delivers test data to the IC 600 via at least one high speed channel 606. The test data enters the IC 600 and is split into a plurality of slow speed channels 620 by at least one demultiplexer 618. The slow speed channels 620 deliver the split test data to at least one multiplexer 622 which then may combine the test data with other data or just forward the test data to the scan chains 610 at a rate of, for example, 25 MHz. A second set of slow speed channels 612 collects the response of the scan chains 610. The slow speed channels 612 are merged by at least one multiplexer 624 into high speed channels 614 that are input into another set of multiplexers 626, which then deliver the merged response(s) of the scan chains 610 to the testing device 616. Multiplexers 622 and 626 provide selectable reconfigurability between direct connections of the scan chains to the I/O pins and combining data into merged higher bandwidth channels.

Figure 6:
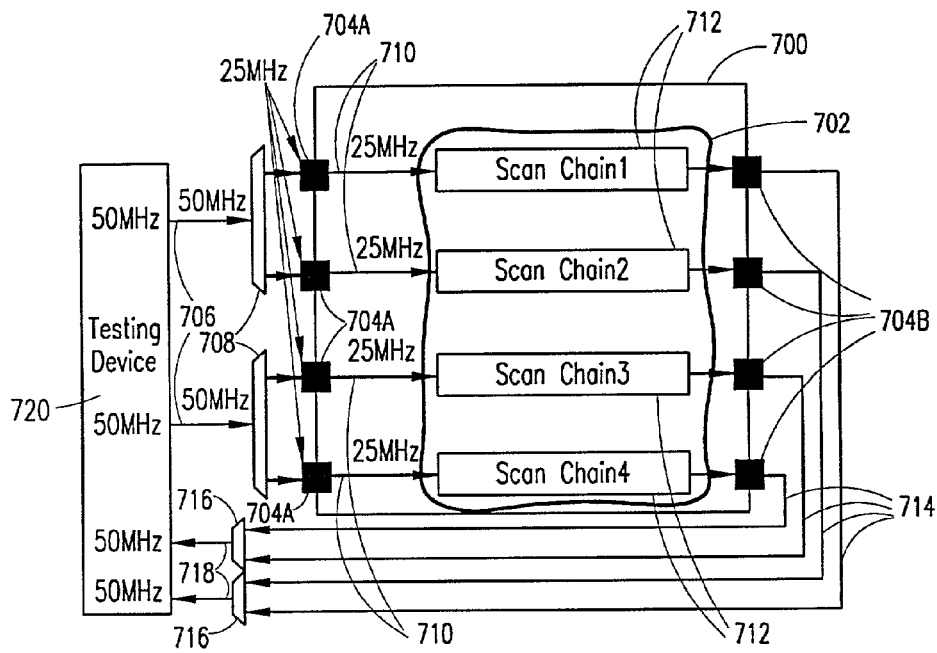
FIG. 6 is an exemplary illustration of an integrated circuit with a fifth configuration of the configurable scan architecture in accordance with a preferred embodiment of the present invention.

FIG. 6 is an exemplary illustration of an IC 700 configured in a fifth embodiment of a scan chain architecture 702 in accordance with the present invention. In this embodiment, the IC 700 has an I/O frequency that is lower than the testing device's test frequency (data rate). The IC's I/O frequency is also lower or equal to the latching frequency of the scan chains 712 in the IC 700. The number of pins 704A, 704B available on the IC 700 is more than the number of pins available for use on the testing device 720 for performing the IC test via the scan chains 712 on the IC's circuitry. In this embodiment, excess testing device frequency can be traded for the lack of available testing device pins by using demultiplexers 708 and multiplexers 716 in the signal paths between the testing device 720 and the IC 700. The testing device 720 delivers test data via high speed channels 706 to demultiplexers 708 on the signal path before the test data reaches the IC 700. The demultiplexers 708 split the test data into slow speed channels 710, which send the test data to the scan chains 712 via IC pins 704A. The responses of the test and the scan chains 712 are collected by slow speed channels 714 at a rate of, for example, 25 MHz, and outputted from the IC 700 via pins 704B to multiplexers 716. The multiplexers 716 merge the response(s) into high speed channels 718 that deliver the response(s) effectively from the scan chains 712 to the testing device 720 at a high rate, e.g. 50 MHz.

Figure 7:
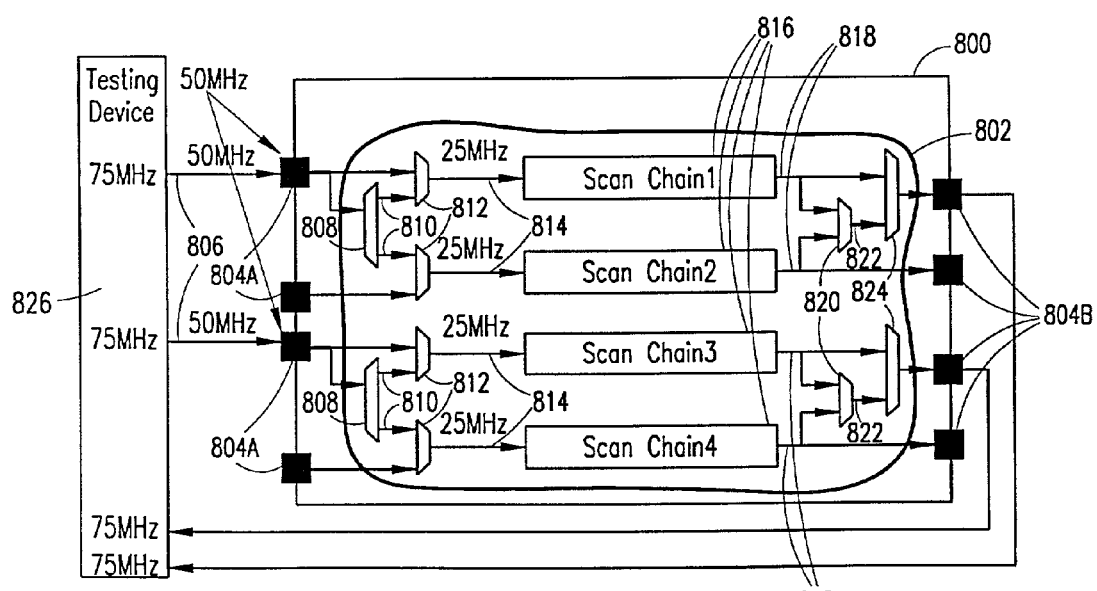
FIG. 7 is an exemplary illustration of an integrated circuit with a sixth configuration of the configurable scan architecture in accordance with a preferred embodiment of the present invention.

FIG. 7 is an exemplary illustration of an IC 800 configured in a sixth embodiment of a scan chain architecture 802 in accordance with the present invention. The IC 800 has an I/O frequency that is lower than the testing device's test frequency, and the IC 800 has more IC pins 804A, 804B available than the testing device 826 has test connections. In addition, the testing device's test frequency and the I/O frequency of the IC 800 are both greater than a multiple of the latching frequency of the scan chains 816. For this embodiment, a design similar to the one in FIG. 6 can be used, however, the multiplexers 812, 820, 822 and demultiplexers 808 can be implemented in the scan chain architecture 802 configured on the IC 800 instead of on the signal path between the testing device and the IC 800 (outside the IC 800). The testing device 826 delivers test data directly to the IC 800 via high speed channels 806. Demultiplexers 808 within the IC 800 split the test data into slow speed channels 810 that send the test data to multiplexers 812, and finally send the test data to the scan chains 816 via slow speed channels 814. The scan chains 816 then perform the data latching and output response(s) from the test data to a second set of slow speed channels 818, e.g. 25 MHz. The slow speed channels 818 deliver the responses to multiplexers 820, within the IC 800, that merge the slow speed channels 818 into high speed channels 822. The high speed channels 822 travel through another set of multiplexers 824 that transmit the responses back to the testing device 826 for comparison with the expected response(s) for the test. Multiplexers 812 and 824 provide selectable reconfigurablity between providing direct connections to the scan chains or providing a merging of two or more scan chains for connection to a test device. It should be noted that even though FIGS. 5 and 7 look similar, the each represent different cases having a bandwidth "bottleneck" at differing places. In FIG. 5 the testing device 6 is the bottleneck cause, but in FIG. 7 the IC I/O frequency creates the bottleneck.

Figure 8:
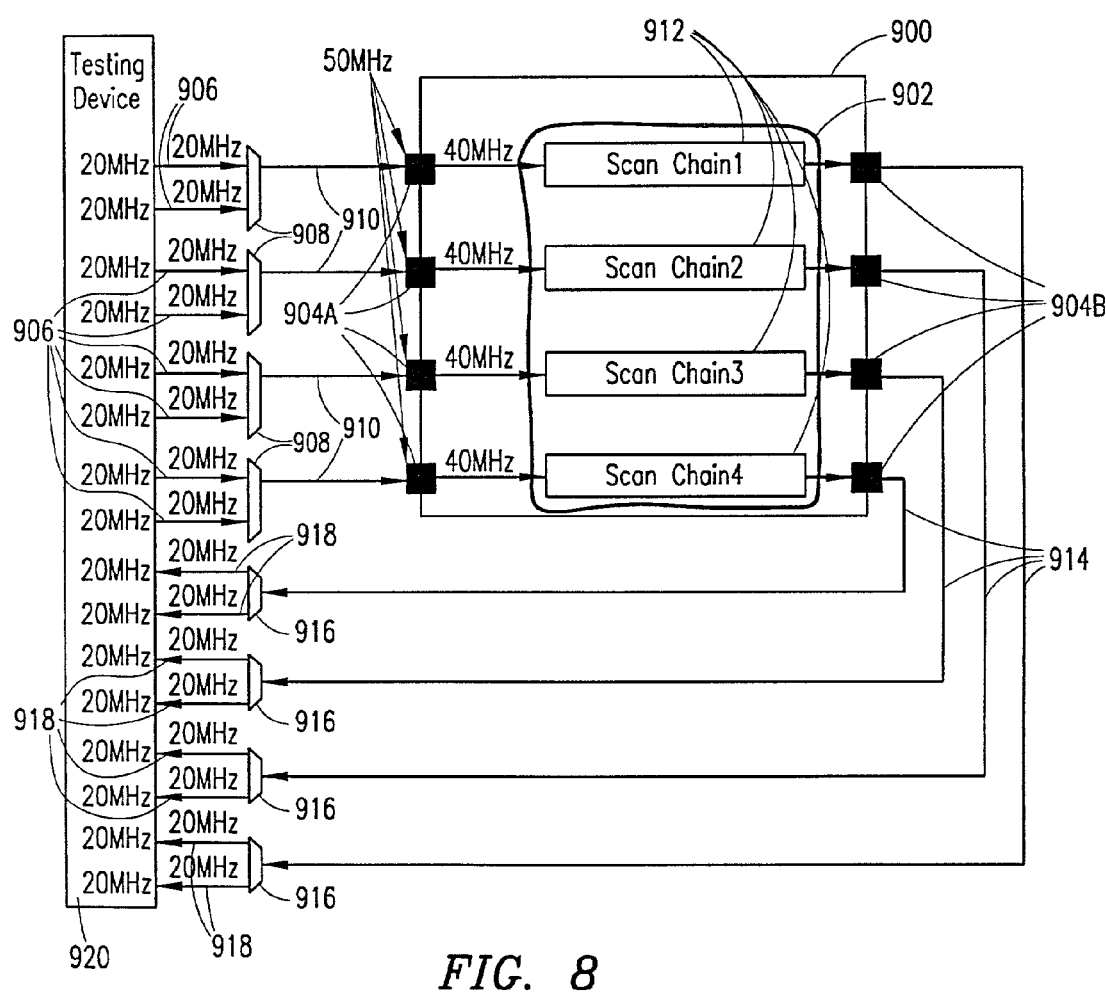
FIG. 8 is an exemplary illustration of an integrated circuit with a seventh configuration of the configurable scan architecture in accordance with a preferred embodiment of the present invention.

FIG. 8 is an exemplary illustration of an IC 900 configured in a seventh embodiment of a scan architecture 902 in accordance with the present invention. The IC 900 in this example has less IC pins 904A, 904B than available on the testing device 920, and the I/O frequency of the IC 900 and the latching frequency of the scan chains 912 are greater than the testing device's test frequency. With the limitations listed above, either the scan chains 912 will have to be run at a slower frequency, which results in longer test times, or a configuration using multiplexers 908 and demultiplexers 916 on the signal path between the testing device 920 and the IC 900 can be used if enough extra pins 904A, 904B are available. Here, the testing device 920 delivers the test data via slow speed channels 906, e.g. 20 MHz, to at least one multiplexer 908 that merges the test data into high speed channels 910 before sending the test data to the IC 900. The high speed channels 910, e.g. 40 MHz, transmit the test data to the scan chains 912 which perform the latching of the test data and output a response thereto. A second set of high speed channels 914 collect the response(s) and deliver them to at least one demultiplexer 916. The at least one demultiplexer 916 splits the response(s) into slow speed channels 918, e.g. 20 MHz, and sends the responses back to the testing device 920.

In the above-mentioned examples, it is assumed that the testing device has a memory large enough to store all the test vectors associated with the test to be performed as well as those associated with the different configurations available in any given IC that incorporates a configurable scan chain architecture. To further reduce complexity of testing an IC, an additional programmable testing device, that has stored the various reconfiguration modes that an IC can support and the protocol associated with each mode, and that generates the test data with vector bit and protocol information for a given mode without regenerating the vectors can be used in association with a testing apparatus.

The previous description is of preferred embodiments for implementing the present invention. The scope of the invention should not be limited by this description, but instead be expanded to the understanding of someone of ordinary skill in the art. The scope of the present invention can only be limited by the following claims.

We claim:

1. A method of configuring an integrated circuit for testing, wherein said integrated circuit comprises:
   a plurality of integrated circuit I/0 pins having a predetermined I/O frequency;
   a plurality of scan chains, in electrical communication with said I/O pins, wherein said scan chains have a predetermined latching frequency, said integrated circuit being adapted for connection to an integrated circuit testing device via an available number of said plurality of integrated circuit I/O pins, said method of configuring said integrated circuit for testing comprising at least one of the steps of:
   (a) minimizing an integrated circuit test time when said latching frequency is less than said predetermined I/O frequency and said available number of said plurality of integrated circuit I/O pins is less than a number of pins required for a proposed scan architecture;
   (b) minimizing said integrated circuit test time when said latching frequency is greater than said predetermined I/O frequency and said available number of said plurality of integrated circuit I/O pins is greater than said number of pins required for a proposed scan architecture;
   (c) minimizing said integrated circuit test time when said integrated circuit testing device frequency is less than said predetermined I/O frequency, the number of integrated circuit testing device pins is less than said available number of said plurality of integrated circuit I/O pins, and said integrated circuit testing device frequency is higher than or equal to a multiple of said predetermined latching frequency;
   (d) minimizing said integrated circuit test time when said integrated circuit testing device frequency is greater tan said predetermined I/O frequency, the number of integrated circuit testing device pins is less than said available number of said plurality of integrated circuit I/O pins and said predetermined I/O frequency is lower than said integrated circuit testing device frequency and said predetermined latching frequency;
   (e) minimizing said integrated circuit test time when said integrated circuit testing device's test frequency is higher than said predetermined I/O frequency and the number of integrated circuit testing device pins is less than said available number of said plurality of integrated circuit I/O pins, and said predetermined I/O frequency and said integrated circuit testing device's test frequency are both higher than a multiple of said predetermined latching frequency; and
   (f) minimizing said integrated circuit test time when said integrated circuit testing device's test frequency is lower than said predetermined I/O frequency and said predetermined latching frequency, and the number of integrated circuit testing device pins is greater than said number of pins required for said proposed scan architecture.

2. The method according to claim 1, wherein said (a) minimizing step further comprises the steps of:
   using at least one high speed channel to bring test data to said integrated circuit from said integrated circuit testing device;
   demultiplexing said at least one high speed channel into a plurality of slow speed channels on said integrated circuit; and
   providing said demultiplexed test data to said plurality of scan chains via said plurality of slow speed channels.

3. The method according to claim 2, further comprising the steps of:
   collecting a response at an output of each of said plurality of scan chains via a second plurality of slow speed channels; and sending the responses to said integrated circuit testing device.

4. The method according to claim 1, wherein said (b) minimizing step further comprises the steps of:
using a plurality of slow speed channels to deliver test data from said integrated circuit testing device to said integrated circuit;
multiplexing said test data on said plurality of slow speed channels into at least one high speed channel; and
providing said multiplexed test data to at least one of said plurality of scan chains via said at least one high speed channel.

5. The method according to claim 4, further comprising the steps of:
collecting a test response at an output of said at least one of said plurality of said scan chains via at least one high speed channel;
demultiplexing said test response on said at least one high speed channel into a second plurality of slow speed channels;
providing the test response to said integrated circuit testing device.

6. The method according to claim 1, wherein said (c) minimizing step further comprises the steps of:
sending test data on a plurality of high speed channels to said integrated circuit from said integrated circuit testing device via said available number of said plurality of integrated circuit I/O pins;
demultiplexing the test data into a plurality of slow speed channels; and
sending the demultiplexed test data to said plurality of scan chains from said at least one demultiplexer via said plurality of slow speed channels.

7. The method according to claim 6, further comprising the steps of:
collecting a response at an output of each of said plurality of scan chains via a second plurality of slow speed channels;
multiplexing, by at least one multiplexer, the responses into a second set of high speed channels; and
sending the responses to said integrated circuit testing device.

8. The method according to claim 1, wherein said (d) minimizing step further comprises the steps of:
providing test data from said integrated circuit testing device to a plurality of demultiplexers using a plurality of high speed channels;
sending the demultiplexed test data from said plurality of demultiplexers to said available number of said plurality of integrated circuit I/O pins;
sending the test data to said plurality of scan chains from said available number of said plurality of integrated circuit I/C) pins.

9. The method according to claim 8, further comprising the steps of:
latching test response data at an output of each of said plurality of scan chains; and
providing the test response data to a plurality of multiplexers;
multiplexing said test response data;
sending the multiplexed test response data responses to at least two of said available number of said plurality of integrated circuit I/O pins; and
multiplexing said multiplexed test response data from said at least two of said available number of said plurality of integrated circuit I/O pins into a single data channel and providing said single data channel to said integrated circuit testing device.

10. The method according to claim 1, wherein said (e) minimizing step further comprises the steps of:
providing test data from said integrated circuit testing device to at least one of the available number of said plurality of integrated circuit I/O pins;
manipulating said test data such that said test data is demultiplexed and available to said plurality of scan chains;
providing said demultiplexed test data to said plurality of scan chains;
manipulating said test result data such that said test result data is multiplexed and made available to a single one of said available number of said plurality of integrated circuit I/O pins; and
providing said multiplexed test result data to said integrated circuit testing device.

11. The method according to claim 1, wherein said (f) minimizing step further comprises the steps of:
using a plurality of slow speed channels to deliver test data to a plurality of multiplexers on a plurality of signal paths between said integrated circuit testing device and said integrated circuit;
multiplexing said plurality of slow speed channels into a plurality of high speed channels; and
sending the test data from said plurality of multiplexers to said plurality of scan chains via said plurality of high speed channels.

12. The method according to claim 11, further comprising the steps of:
collecting a response at an output of each of said plurality of scan chains via a second plurality of high speed channels;
sending the responses to a plurality of demultiplexers on said plurality of signal paths between said integrated circuit testing device and said integrated circuit;
demultiplexing said second plurality of high speed channels into a second plurality of slow speed channels; and
sending each of the responses via said second plurality of slow speed channels to said integrated circuit testing device from said plurality of demultiplexers.

13. The method of claim 1, wherein said plurality of integrated circuit I/O pins are integrated circuit pins that can be utilized as scan chain I/O pins.

14. An integrated circuit adapted for testing on a variety of IC test devices, said integrated circuit comprising:
integrated circuitry;
scan chain circuitry, said scan chain circuitry being adapted to receive a configuration signal which instructs said scan chain circuitry to be configured to a predetermined configuration based on a plurality of physical attributes associated with both said scan chain circuitry and said integrated circuitry, said scan chain circuitry adapted to receive test data from an integrated circuit test device, latch said test data into first predetermined portions of said integrated circuitry via scan chains, latch out test result data from second predetermined portions of said integrated circuit via said scan chains, and provide said test result data to said integrated circuit test device; and
at least one of one or more multiplexer circuits for receiving at least two channels of test data from at least two of said scan chains and for combining said at least two channels of test data into a single channel and one or more multiplexer circuits for receiving at least two channels of test data from said integrated circuit testing device, each of said two channels being at a first data rate and combining said at least two channels of test data into a single channel of test data having a second data rate.

15. The integrated circuit of claim 14, wherein said physical attributes include at least one of a I/O frequency of the integrated circuitry, a testing frequency of an associated integrated circuit testing device, a number of testing pins available on said integrated circuit, an operating frequency of the scan chain circuitry, and a number of available test connections available on said integrated circuit testing device.

16. The integrated circuit of claim 14, wherein said scan chain circuitry further comprises at least one demultiplexer for receiving a channel of test result data from one of said scan chains and for dividing said test result data into at least two channels of test result data.

17. The integrated circuit of claim 14, wherein said scan chain circuitry further comprises at least one demultiplexer circuit for receiving test data from said integrated circuit testing device at a first data rate and dividing the test data into a plurality of data streams, each of said plurality of data streams having a second data rate, said second data rate being lower than said first data rate.

18. An integrated circuit adapted for testing on a variety of IC test devices, said integrated circuit comprising:
   integrated circuitry;
   scan chain circuitry, said scan chain circuitry being adapted to receive a configuration signal which instructs said scan chain circuitry to be configured to a predetermined configuration based on a plurality of physical attributes associated with both said scan chain circuitry and said integrated circuitry, said scan chain circuitry adapted to receive test data from an integrated circuit test device, latch said test data into first predetermined portions of said integrated circuitry via scan chains, latch out test result data from second predetermined portions of said integrated circuit via said scan chains, and provide said test result data to said integrated circuit test device; and
   at least one of one or more demultiplexer circuits for receiving test data from said integrated circuit testing device at a first data rate and dividing the test data into a plurality of data streams, each of said plurality of data streams having a second data rate and one or more demultiplexer circuits for receiving a channel of test result data from one of said scan chains and for dividing said test result data into at least two channels of test result data.

19. The integrated circuit of claim 18, wherein said scan chain circuitry further comprises at least one multiplexer circuit for receiving at least two channels of test data from said integrated circuit testing device, each of said two channels being at a first data rate and combining said at least two channels of test data into a single channel of test data having a second data rate, said first data rate being lower than said second data rate.

20. The integrated circuit of claim 18, wherein said scan chain circuitry further comprises at least one multiplexer circuit for receiving at least two channels of test data from at least two of said scan chains and for combining said at least two channels of test data into a single channel which is directed for communications to said integrated circuit testing device.

21. The integrated circuit of claim 18, wherein said physical attributes include at least one of a I/O frequency of the integrated circuitry, a testing frequency of an associated integrated circuit testing device, a number of testing pins available on said integrated circuit, an operating frequency of the scan chain circuitry, and a number of available test connections available on said integrated circuit testing device.

* * * * *